(12) United States Patent
Ono et al.

(10) Patent No.: US 8,458,633 B2
(45) Date of Patent: Jun. 4, 2013

(54) SEMICONDUCTOR INTEGRATED CIRCUIT DESIGN APPARATUS AND METHOD FOR ANALYZING A DELAY IN A SEMICONDUCTOR INTEGRATED CIRCUIT

(75) Inventors: Yoshihiro Ono, Tokyo (JP); Takeshi Watanabe, Kanagawa (JP); Naoshi Doi, Kanagawa (JP); Itsuki Yamada, Kanagawa (JP); Tsuneo Tsukagoshi, Tokyo (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/262,759

(22) PCT Filed: Apr. 21, 2010

(86) PCT No.: PCT/JP2010/002881
§ 371 (c)(1),
(2), (4) Date: Dec. 1, 2011

(87) PCT Pub. No.: WO2010/134264
PCT Pub. Date: Nov. 25, 2010

(65) Prior Publication Data
US 2012/0096421 A1 Apr. 19, 2012

(30) Foreign Application Priority Data
May 20, 2009 (JP) .................... 2009-121783

(51) Int. Cl.
*G06F 17/50* (2006.01)
*G06F 9/455* (2006.01)
*G06G 7/62* (2006.01)

(52) U.S. Cl.
USPC ........... 716/113; 716/108; 716/115; 716/134; 703/13

(58) Field of Classification Search
None
See application file for complete search history.

(56) References Cited

U.S. PATENT DOCUMENTS

| 7,313,771 | B2* | 12/2007 | Reddy et al. ................. 716/136 |
| 7,490,309 | B1* | 2/2009 | Kukal et al. .................. 716/132 |
| 8,020,130 | B2* | 9/2011 | Nagata ......................... 716/115 |
| 8,224,601 | B2* | 7/2012 | Okumura ....................... 702/65 |
| 2007/0136705 | A1* | 6/2007 | Hosono ........................... 716/6 |

FOREIGN PATENT DOCUMENTS

| JP | 06-124318 A | 5/1994 |
| JP | 07-239865 A | 9/1995 |
| JP | 09-054798 A | 2/1997 |
| JP | 2000-148826 A | 5/2000 |
| JP | 2000-194732 A | 7/2000 |
| JP | 2000-195960 A | 7/2000 |
| JP | 2002-270695 A | 9/2002 |

(Continued)

*Primary Examiner* — A. M. Thompson
(74) *Attorney, Agent, or Firm* — Sughrue Mion, PLLC

(57) ABSTRACT

A semiconductor integrated circuit design apparatus for analyzing a delay in a semiconductor integrated circuit. The semiconductor integrated circuit includes a delay analysis unit, a noise generation unit, a voltage fluctuation level analysis unit and a timing verification unit. The noise generation unit generates noise information based on a predetermined noise definition and the voltage fluctuation level analysis unit analyzes a voltage fluctuation level of the semiconductor integrated circuit when the noise is applied based on the generated noise information. Further, the timing verification unit makes the delay analysis unit analyze the static delay based on the analyzed voltage fluctuation level, to verify timing for operation of the semiconductor integrated circuit based on a result of the static delay analysis.

10 Claims, 12 Drawing Sheets

FOREIGN PATENT DOCUMENTS

| | | |
|---|---|---|
| JP | 2003-271696 A | 9/2003 |
| JP | 2004-118802 A | 4/2004 |
| JP | 2005-004268 A | 1/2005 |
| JP | 2006-215987 A | 8/2006 |
| JP | 2008-083815 A | 4/2008 |
| JP | 2008-250630 A | 10/2008 |
| JP | 2008-287666 A | 11/2008 |

* cited by examiner

Related Art
FIG. 12
(a)
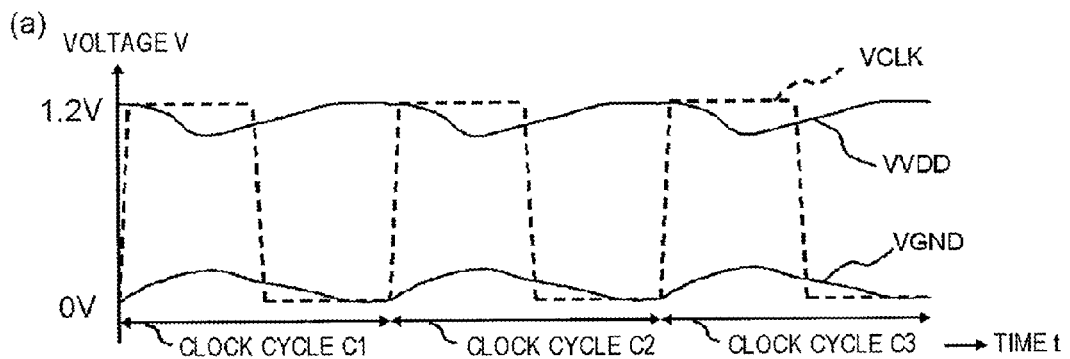
Related Art
(b)
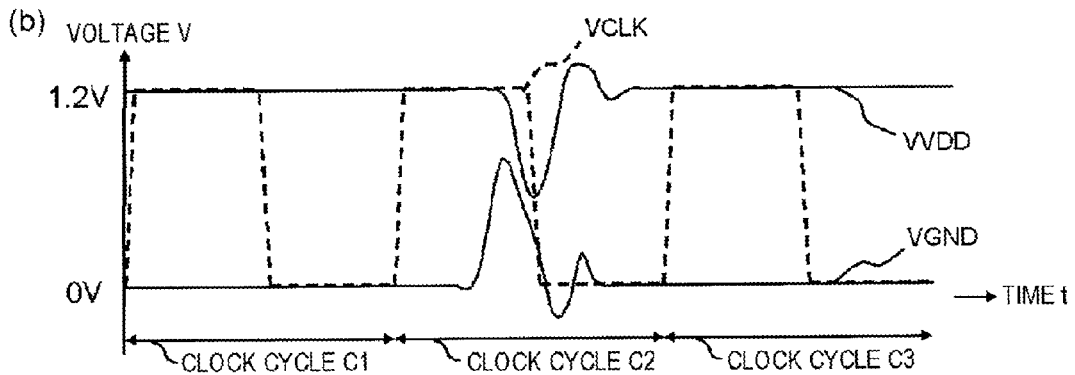

SEMICONDUCTOR INTEGRATED CIRCUIT DESIGN APPARATUS AND METHOD FOR ANALYZING A DELAY IN A SEMICONDUCTOR INTEGRATED CIRCUIT

CROSS-REFERENCE TO RELATED APPLICATIONS

This application is a National Stage of International Application No. PCT/JP2010/002881 filed Apr. 21, 2010, claiming priority based on Japanese Patent Application No. 2009-121783 filed May 20, 2003, the contents of all of which are incorporated herein by reference in their entirety.

TECHNICAL FIELD

The present invention relates to a semiconductor integrated circuit design apparatus, a data processing method thereof, and a control program thereof, and particularly relates to a semiconductor integrated circuit design apparatus which analyzes a delay in a semiconductor integrated circuit, a data processing method thereof, and a control program thereof.

BACKGROUND ART

A semiconductor integrated circuit includes logic elements 1 (FIG. 11) for performing an operation and controlling the operation, and sequential circuit elements 5 (also referred to as flip-flops) (FF1, FF2 in FIG. 11) for synchronizing an operation of a logic element group 3. Each flip-flop 5 is supplied with a clock signal CLK that cyclically oscillates. Data held by the flip-flop 5 is then supplied to the logic element 1 in accordance with a rising edge or a falling edge of the clock signal CLK. The logic element 1 then performs an operation and controls the operation by use of the supplied data as an input, to store a result thereof into the flip-flop 5. The above process is repeatedly performed in accordance with the rising edge of or the falling edge of the clock signal CLK that cyclically changes.

A design process of the semiconductor integrated circuit performs: analyzing a delay in the clock signal CLK that is supplied to the flip-flop 5; simulating operations of the circuit with reference to the clock signal CLK; and verifying whether the circuit can operate with normal timing.

Patent Document 1 discloses an example of timing verification method for verifying operation timing in view of a voltage drop of power-supply wiring in a semiconductor integrated circuit. The timing verification method of Patent Document 1 includes: setting a maximal value of a power-supply voltage drop level which is permitted in a semiconductor chip as a target power-supply voltage drop level; calculating a power-supply voltage drop level for timing verification based on the target power-supply voltage drop level; performing a first timing verification in view of a delay fluctuation according to the power-supply voltage drop level; thereafter comparing a power-supply voltage drop level of each cell with the power-supply voltage drop level for the timing verification, the power-supply voltage drop level being obtained from an analysis result of a power supply net analysis; and recalculating the delay fluctuation in accordance with the power-supply voltage drop level of the cell having a different level in a result of the comparison to perform a second timing verification.

Further, Patent Document 2 discloses an example of semiconductor design supporting apparatus that performs a logic simulation analysis/STA analysis in view of noise. The semiconductor design supporting apparatus of Patent Document 2 is a semiconductor design supporting apparatus provided with a power-supply noise level library and an output signal change level library, and the power-supply noise level library stores power-supply noise data obtained by analyzing power-supply noise generated in an input/output unit. Further, the output signal change level library stores output signal change data showing a signal waveform that changes in response to the power-supply noise data. This semiconductor design supporting apparatus disclosed in Patent Document 2 generates a noise corresponding I/O layout model showing the input/output unit of a semiconductor device which corresponds to the power-supply noise, and predicts timing for operation of the semiconductor device based on the output signal change data and the noise corresponding I/O layout model.

Further, Patent Document 3 discloses a logic circuit operation verifying apparatus, capable of verifying a power-supply voltage drop and a ground bounce, which are problematic in a large-scaled CMOS LSI, in a design stage of a chip before manufacturing thereof, to obtain an indicator for optimizing power-supply wiring, and further to detect a margin of a propagation delay caused by the power-supply voltage drop or the ground bounce.

Patent Document 4 discloses an apparatus and a method for simulating a semiconductor integrated circuit, which reflect time-series voltage fluctuation information to a delay simulation, to obtain a highly accurate delay simulation result.

Patent Document 5 discloses an apparatus and a method for calculating a delay in a semiconductor integrated circuit and an apparatus and a method for verifying timing thereof, which calculate a voltage drop due to power-supply wiring and consider the voltage drop with respect to each kind of elements, to perform highly reliable delay calculation and timing verification.

Other than this, Patent Documents 6 to 12 disclose examples of the timing verification methods for verifying operation timing in view of a voltage drop of power-supply wiring in a semiconductor integrated circuit.

RELATED DOCUMENTS

Patent Documents

[Patent Document 1] Japanese Laid-open patent publication No. 2004-118802
[Patent Document 2] Japanese Laid-open patent publication No. 2008-83815
[Patent Document 3] Japanese Laid-open patent publication No. 2000-148826
[Patent Document 4] Japanese Laid-open patent publication No. 2000-194732
[Patent Document 5] Japanese Laid-open patent publication No. 2000-195960
[Patent Document 6] Japanese Laid-open patent publication No. 2003-271696
[Patent Document 7] Japanese Laid-open patent publication No. 2005-4268
[Patent Document 8] Japanese Laid-open patent publication No. 2006-215987
[Patent Document 9] Japanese Laid-open patent publication No. 2008-250630
[Patent Document 10] Japanese Laid-open patent publication No. H06-124318
[Patent Document 11] Japanese Laid-open patent publication No. H07-239865

[Patent Document 12] Japanese Laid-open patent publication No. H09-54798

DISCLOSURE OF THE INVENTION

In each of the foregoing techniques disclosed in the above documents, only the case of the chip performing a normal operation is considered, and there has thus been a problem in that, when a voltage fluctuates due to noise suddenly applied from the outside of the chip, an influence on a delay cannot be taken into account.

This is because, while almost an equal voltage fluctuation is repeated in line with a clock cycle as shown in FIG. 12(a) in the case of the chip performing the normal operation, a voltage fluctuation due to noise from the outside occurs irrespective of the clock cycle, as shown in FIG. 12(b).

The present invention was made in the light of the above circumstances, and has an object to provide a semiconductor integrated circuit design apparatus which is capable of performing a delay analysis in the case of fluctuation in voltage due to noise that is applied from the outside of a chip, in view of the influence thereof, and a data processing method and a control program of the apparatus.

According to the present invention, there is provided a semiconductor integrated circuit design apparatus including: a delay analysis unit which analyzes a static delay based on chip information on a semiconductor integrated circuit, the semiconductor integrated circuit including flip-flops, the static delay being analyzed on respective paths between the flip-flops; a noise generation unit which generates, based on a predetermined noise definition, noise information on noise to be applied to the semiconductor integrated circuit; a voltage fluctuation level analysis unit which analyzes, based on the chip information on the semiconductor integrated circuit, a voltage fluctuation level of the semiconductor integrated circuit, the voltage fluctuation level being analyzed when the noise is applied to a predetermined location of the semiconductor integrated circuit based on the noise information; and a timing verification unit which makes the delay analysis unit analyze the static delay based on the voltage fluctuation level analyzed by the voltage fluctuation level analysis unit, the timing verification unit verifying timing for operation of the semiconductor integrated circuit based on a result of analysis on the static delay in respective paths of the semiconductor integrated circuit, wherein the noise generation unit generates noise information on the noise to be applied at predetermined application timing, and the timing verification unit verifies the timing with respect to each noise that is applied at the predetermined application timing.

According to the present invention, there is provided a data processing method of a semiconductor integrated circuit design apparatus, wherein the semiconductor integrated circuit design apparatus performs: analyzing a static delay based on chip information on a semiconductor integrated circuit, the semiconductor integrated circuit including flip-flops, the static delay being analyzed on respective paths between the flip-flops; generating, based on a predetermined noise definition, noise information on a noise to be applied to the semiconductor integrated circuit; analyzing, based on the chip information on the semiconductor integrated circuit, a voltage fluctuation level of the semiconductor integrated circuit, the voltage fluctuation level being analyzed when the noise is applied to a predetermined location of the semiconductor integrated circuit based on the noise information; analyzing the static delay in the respective paths between the flip-flops in the semiconductor integrated circuit based on the chip information on the semiconductor integrated circuit in accordance with the analyzed voltage fluctuation level; verifying timing for operation of the semiconductor integrated circuit based on a result of analysis on the static delay in respective paths of the semiconductor integrated circuit, the timing being verified with respect to each noise that is applied at the predetermined application timing.

According to the present invention, there is provided a control program of a semiconductor integrated circuit design apparatus, which makes a computer execute: a procedure for analyzing a static delay based on chip information on a semiconductor integrated circuit, the semiconductor integrated circuit including flip-flops, the static delay being analyzed on respective paths between flip-flops; a procedure for generating, based on a predetermined noise definition, noise information on a predetermined noise to be applied to the semiconductor integrated circuit; a procedure for analyzing, based on the chip information on the semiconductor integrated circuit, a voltage fluctuation level of the semiconductor integrated circuit, the voltage fluctuation level being analyzed when the noise is applied to a predetermined location of the semiconductor integrated circuit based on the noise information; a procedure for making the procedure for analyzing the static delay analyze the static delay based on the voltage fluctuation level, the voltage fluctuation level being analyzed by the procedure for analyzing the voltage fluctuation level; a procedure for verifying timing for operation of the semiconductor integrated circuit based on a result of analysis on the static delay in respective paths of the semiconductor integrated circuit; a procedure for generating noise information on noise to be applied at predetermined application timing; and a procedure for verifying the timing with respect to each noise that is applied at the predetermined application timing.

It is to be noted that one obtained by converting an arbitrary combination of the above constitutional elements or the expression of the invention between methods, apparatuses, systems, record mediums, computer programs or the like is also effective as an aspect of the invention.

Further, a variety of constitutional elements of the invention are not necessarily individually independent existence, but may be formed such that a plurality of constitutional elements are formed as one member, one constitutional element is formed as a plurality of members, one constitutional element is part of another constitutional element, or part of one constitutional element overlaps with part of another constitutional element.

Moreover, although a plurality of procedures are sequentially described in the data processing method and the computer program of the invention, the described sequence does not limit a sequence of execution of the plurality of procedures. On this account, in carrying out the data processing method and the computer program of the invention, the sequence of the plurality of procedures may be changed within a range not interfering with the procedures in terms of details thereof.

Furthermore, the plurality of procedures in the data processing method and the computer program of the invention are not limited to execution with individually different timing. Therefore, the procedures may be executed such that another procedure occurs during execution of one procedure, or execution timing for one procedure overlaps with part or all of execution timing for another procedure.

According to the invention, there are provided a semiconductor integrated circuit design apparatus which is capable of performing a delay analysis in the case of fluctuation in voltage due to noise that is applied from the outside of a chip, in view of the influence thereof, and a data processing method and a control program of the apparatus.

BRIEF DESCRIPTION OF THE DRAWINGS

The foregoing object, other objects, characteristics and advantages will further be made obvious by means of exemplary embodiments that will be described hereinafter and the following drawings associated with the exemplary embodiments.

FIGS. 12(a) and 12(b) are diagrams showing a voltage fluctuation due to the influence of noise in the semiconductor integrated circuit.

DESCRIPTION OF EXEMPLARY EMBODIMENTS

Figure 1:
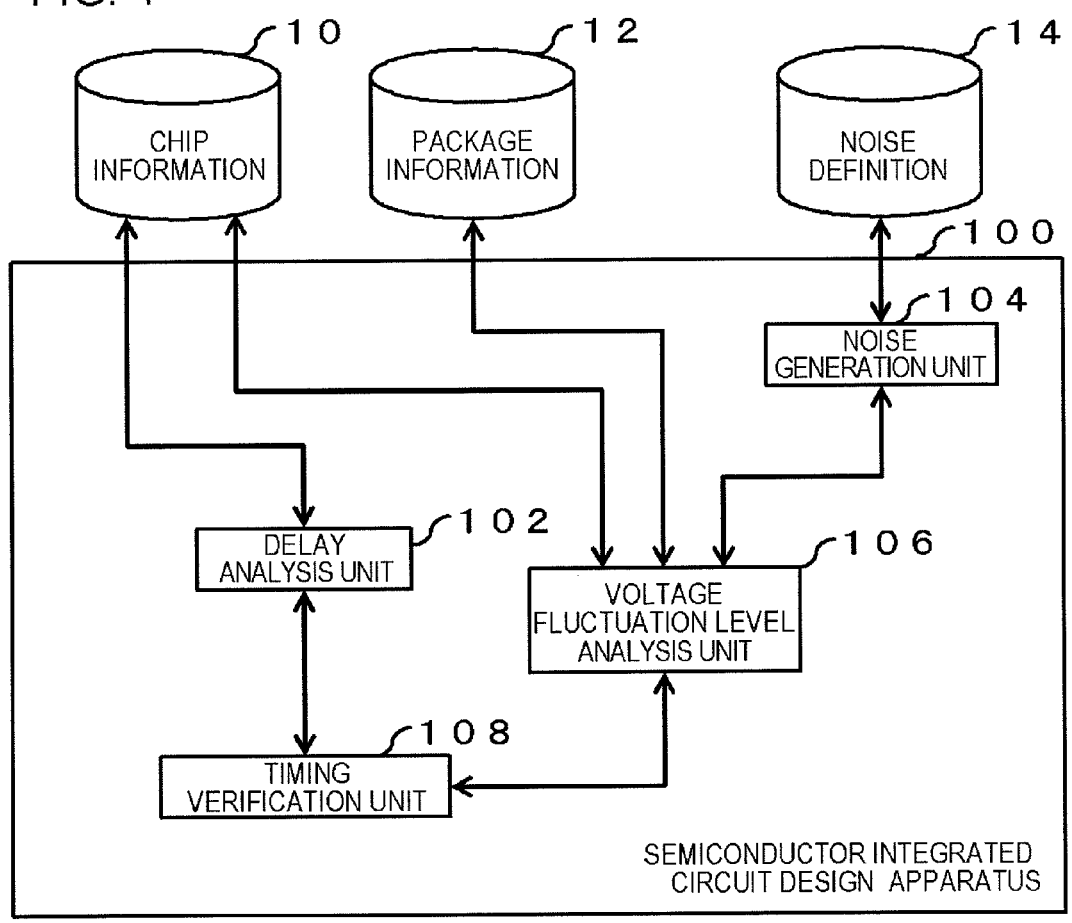
FIG. 1 is a functional block diagram showing a configuration of a semiconductor integrated circuit design apparatus according to an exemplary embodiment of the invention.

Hereinafter, exemplary embodiments of the invention will be described using the drawings. It is to be noted that in all of the drawings, similar constitutional elements will be provided with similar reference numerals, and descriptions thereof will not be repeated as appropriate.

First Exemplary Embodiment

FIG. 1 is a functional block diagram showing a configuration of a semiconductor integrated circuit design apparatus 100 according to an exemplary embodiment of the invention.

The semiconductor integrated circuit design apparatus 100 of the exemplary embodiment includes: a delay analysis unit 102 which analyzes a static delay based on chip information on a semiconductor integrated circuit (not shown in the drawings), the semiconductor integrated circuit including flip-flops, the static delay being analyzed on respective paths between the flip-flops; a noise generation unit 104 which generates, based on a predetermined noise definition, noise information on noise to be applied to the semiconductor integrated circuit; a voltage fluctuation level analysis unit 106 which analyzes, based on the chip information on the semiconductor integrated circuit, a voltage fluctuation level of the semiconductor integrated circuit, the voltage fluctuation level being analyzed when the noise is applied to a predetermined location of the semiconductor integrated circuit based on the noise information; and a timing verification unit 108 which makes the delay analysis unit 102 analyze the static delay based on the voltage fluctuation level analyzed by the voltage fluctuation level analysis unit 106, the timing verification unit 108 verifying timing for operation of the semiconductor integrated circuit based on a result of analysis on the static delay in respective paths of the semiconductor integrated circuit, wherein the noise generation unit 104 generates noise information on noise to be applied at predetermined application timing, and the timing verification unit 108 verifies the timing with respect to each noise that is applied at the predetermined application timing.

The semiconductor integrated circuit design apparatus 100 of the exemplary embodiment may be configured of a general computer including a control device, a storage device, an input device and a display device. Each part of these devices is not shown in the drawings. Further, each of the above units is constructed on the storage device such as a Read Only Memory (ROM) or a Random Access Memory (RAM), and controlled by the control device which runs in accordance with a computer program stored in the storage device. It should be noted that in the following drawings, a configuration of a portion not associated with an essence of the invention will not be repeated and not shown in the drawings.

That is, each of the constitutional elements of the semiconductor integrated circuit design apparatus 100 is realized by an arbitrary combination of hardware and software in an arbitrary computer, which mainly are a Central Processing Unit (CPU), a memory, a program loaded in the memory to realize constitutional elements in the drawing, a storage unit to store the program such as a hard disk, and an interface for network connection. The skilled person in the art would understand that there are a variety of modified examples of a method and an apparatus for the realization. Each of the drawings described hereinafter will not show a configuration in a unit of hardware, but will show a block in a unit of function.

The semiconductor integrated circuit design apparatus 100 may be implemented, for example, in a Computer Aided Design (CAD) system. The semiconductor integrated circuit design apparatus 100 enables a delay analysis to take into account a voltage fluctuation caused by noise that is applied from the outside when a layout of a semiconductor integrated circuit is designed.

Specifically, the semiconductor integrated circuit design apparatus 100 of the exemplary embodiment is provided with the delay analysis unit 102, the noise generation unit 104, the voltage fluctuation level analysis unit 106 and the timing verification unit 108. The semiconductor integrated circuit design apparatus 100 is connected with a chip information storage unit (shown as "chip information" in the drawings) 10, a package information storage unit (shown as "package information" in the drawings) 12, and a noise definition storage unit (shown as "noise definition" in the drawings) 14. The semiconductor integrated circuit design apparatus 100 can read chip information, package information and noise definition information on a semiconductor integrated circuit which are stored in the chip information storage unit 10, the package information storage unit 12 and the noise definition storage unit 14, respectively.

Each storage unit may be included in the semiconductor integrated circuit design apparatus 100, may be included in a server device connected to the semiconductor integrated circuit design apparatus 100 through a network, may be included in an external storage device connected to the semiconductor integrated circuit design apparatus 100, or may be included in a variety of record mediums accessible by a record medium reading device connected to the semiconductor integrated circuit design apparatus 100.

Chip information stored in the chip information storage unit 10, for example, include a net list, layout information, a cell delay library, and a technology library of the semiconductor integrated circuit.

Figure 2:
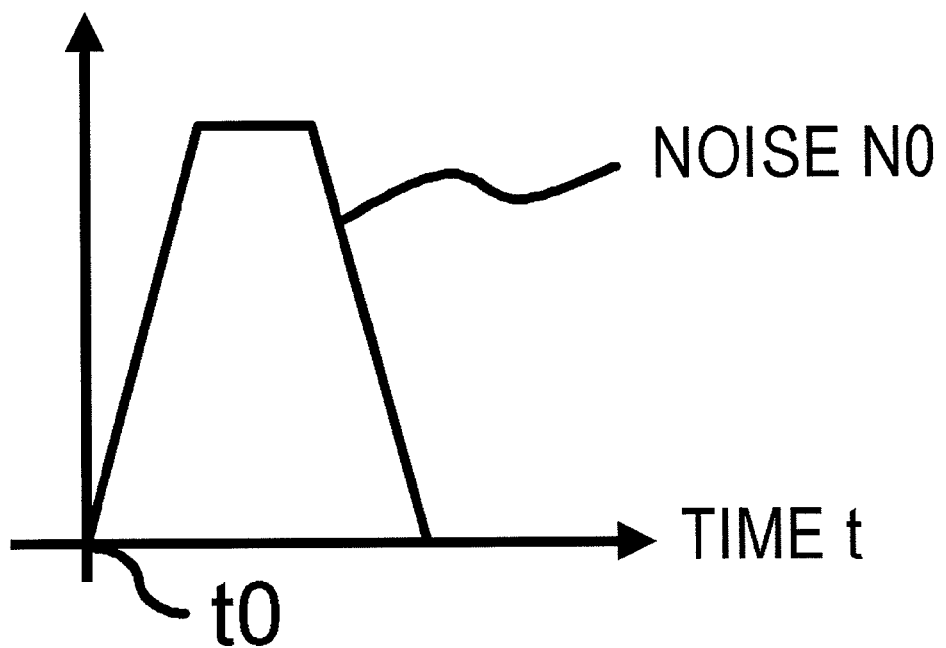
FIG. 2 is a diagram showing an example of noise definitions used in the semiconductor integrated circuit design apparatus according to the exemplary embodiment of the invention.

The noise definition information stored in the noise definition storage unit 14 is information that defines noise to be applied to the semiconductor integrated circuit. For example, as shown in FIG. 2, noise NO defined by the noise definition information is represented by a relationship between a time t and a voltage V with time t0 regarded as noise application start time. Although the noise NO shows a trapezoidal wave as a typical example in FIG. 2, the waveform is not limited to this, but may be any noise waveform.

The delay analysis unit 102 is a delay analysis device generally used when a semiconductor integrated circuit is designed. The delay analysis unit 102 inputs data of chip information on the semiconductor integrated circuit from the chip information storage unit 10, analyzes a static delay, and outputs a report of the analyzed result. The delay analysis unit 102, for example, extracts RC from the layout information and the technology library, and analyzes a static delay using the extracted RC information, the net list and the cell delay library. When a path is found not to satisfy a design constraint condition as a result of analysis on the delay in the delay analysis unit 102, cell rearrangement or rewiring may be performed to make it possible to design a circuit satisfy the design constraint condition. The skilled person in the art understands the delay analysis, the output of the report on the analysis result, and the like, and they are not associated with the essence of the invention. Thus, the detailed descriptions will not be repeated.

The noise generation unit 104 generates noise information relating to noise to be applied to the semiconductor integrated circuit, the noise information being generated based on predetermined noise definition information (FIG. 2) stored in the noise definition storage unit 14, and inputs the generated information into the later-mentioned voltage fluctuation level analysis unit 106. The noise generation unit 104 may generate noise information, according to which noise defined by the noise definition is applied to the semiconductor integrated circuit at a variety of timing within the clock cycle.

The voltage fluctuation level analysis unit 106 accepts, as inputs, chip information from the chip information storage unit 10, package information from the package information storage unit 12 and noise information from the noise generation unit 104, and obtains voltage (VVDD and VGND) waveforms that appear at a VDD terminal and a GND terminal of each cell within the chip when noise is applied to a predetermined location of a package, such as a power-supply voltage unit (not shown in the drawings). Herein, the package means a circuit that connects a substrate and the chip, and among those packages, the package handled herein is one obtained by modeling a power supply circuit in RLC form. The voltage waveforms required in the voltage fluctuation level analysis unit 106 include a normal voltage fluctuation at the time of circuit operation and a voltage fluctuation caused by noise that is applied to the package.

That is, it is possible to obtain waveforms of voltages (VVDD, VGND) that repeat almost an equal fluctuation to a fluctuation in clock voltage (VCLK) that fluctuates in line with clock cycles (C1, C2, C3, . . . ) as shown in FIG. 12(a), and voltages (VVDD, VGND) that fluctuate caused by the influence of noise generated with timing irrespective of the fluctuation in clock voltage (VCLK) that fluctuates in line with the clock cycles (C1, C2, C3, . . . ) as shown in FIG. 12(b).

The timing verification unit 108 is operated using a circuit simulator generally used when a semiconductor integrated circuit is designed. A delay is analyzed on a path between each cell of the semiconductor integrated circuit. At this time, voltage data output from the voltage fluctuation level analysis unit 106 is used for the voltages (VVDD and VGND) at the VDD terminal and the GND terminal of each cell. That is, in the exemplary embodiment, the timing verification unit 108 uses the voltage data output from the voltage fluctuation level analysis unit 106, and thus can analyze the delay in the path in view of the influence of noise that is applied from the outside.

In the semiconductor integrated circuit design apparatus 100 of the exemplary embodiment, each function of each of the above units may be realized by the CPU reading the program, stored in the hard disk, into the memory and executing the read program.

The control program of the exemplary embodiment is described so as to make a computer for realizing the semiconductor integrated circuit design apparatus 100 execute: a procedure for analyzing a static delay based on chip information on a semiconductor integrated circuit, the semiconductor integrated circuit including flip-flops, the static delay being analyzed on respective paths between flip-flops; a procedure for generating, based on a predetermined noise definition, noise information on a predetermined noise to be applied to the semiconductor integrated circuit; a procedure for analyzing, based on the chip information on the semiconductor integrated circuit, a voltage fluctuation level of the semiconductor integrated circuit, the voltage fluctuation level being analyzed when the noise is applied to a predetermined location of the semiconductor integrated circuit based on the noise information; a procedure for making the procedure for analyzing the static delay analyze the static delay based on the voltage fluctuation level, the voltage fluctuation level being analyzed by the procedure for analyzing the voltage fluctuation level; a procedure for verifying timing for operation of the semiconductor integrated circuit based on a result of analysis on the static delay in respective paths of the semiconductor integrated circuit; a procedure for generating noise information on noise to be applied at predetermined application timing; and a procedure for verifying the timing with respect to each noise that is applied at the predetermined application timing.

It is to be noted that the control program for the semiconductor integrated circuit design apparatus may be recorded in a record medium readable by the computer.

The operation of the semiconductor integrated circuit design apparatus 100 of the exemplary embodiment as thus configured will be described hereinafter.

Figure 3:
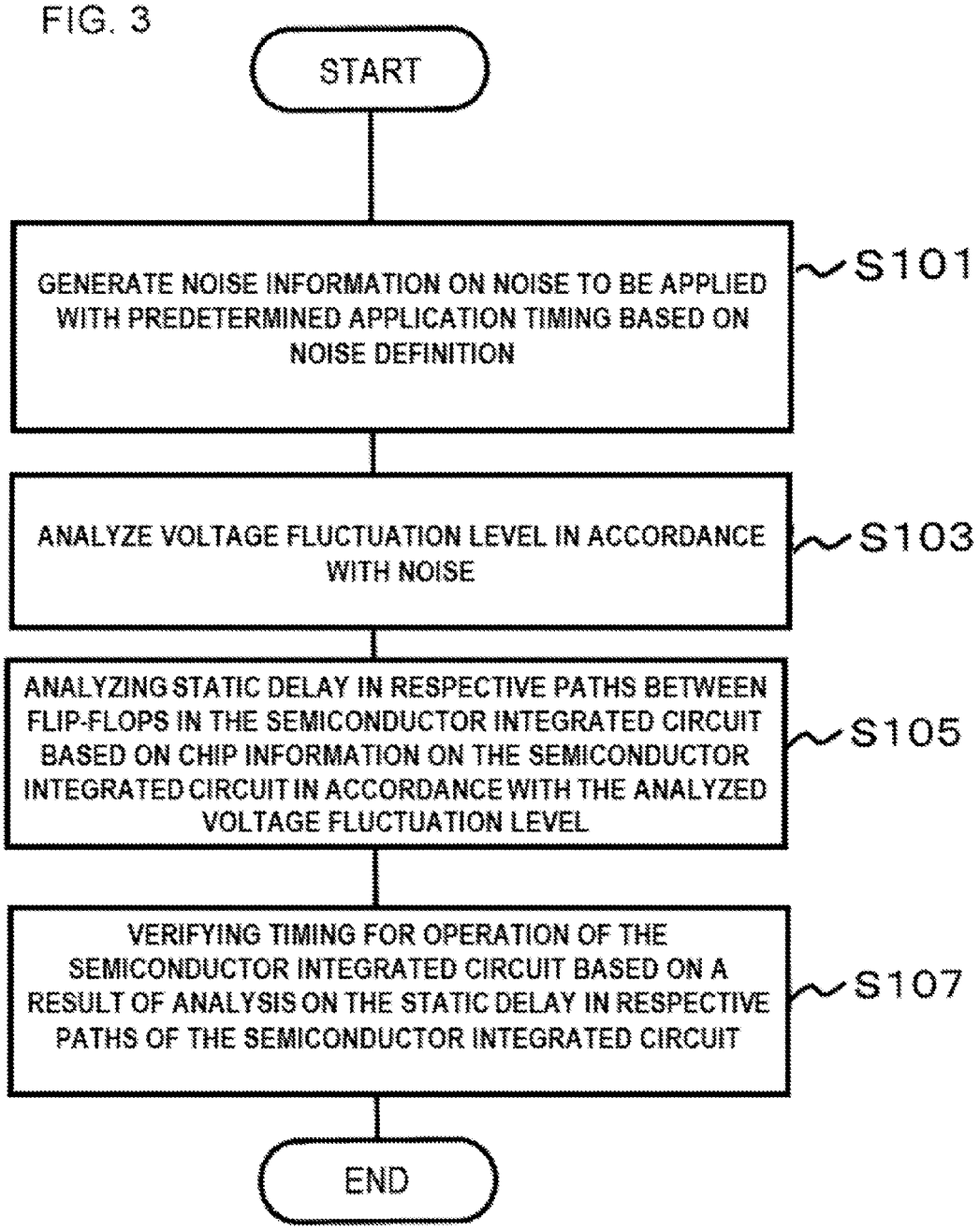
FIG. 3 is a flowchart showing an example of operations of the semiconductor integrated circuit design apparatus according to the exemplary embodiment of the invention.

FIG. 3 is a flowchart showing an example of the operations of the semiconductor integrated circuit design apparatus 100 according to the exemplary embodiment.

In a data processing method of a semiconductor integrated circuit design apparatus 100 of the exemplary embodiment, wherein the semiconductor integrated circuit design apparatus 100 performs: analyzing a static delay based on chip information on a semiconductor integrated circuit, the semiconductor integrated circuit including flip-flops, the static delay being analyzed on respective paths between the flip-flops; generating, based on a predetermined noise definition, noise information on a noise to be applied to the semiconductor integrated circuit (Step 101); analyzing, based on the chip information on the semiconductor integrated circuit, a voltage fluctuation level of said semiconductor integrated circuit, the voltage fluctuation level being analyzed when the noise is applied to a predetermined location of the semiconductor integrated circuit based on the noise information (Step 103); analyzing the static delay in the respective paths between the flip-flops in the semiconductor integrated circuit based on the chip information on the semiconductor integrated circuit in accordance with the analyzed voltage fluctuation level (Step 105); verifying timing for operation of the semiconductor integrated circuit based on a result of analysis on the static delay in respective paths of the semiconductor integrated circuit, the timing being verified with respect to each noise that is applied at the predetermined application timing (Step 107).

Specifically, based on a predetermined noise definition, the noise generation unit 104 generates noise information relating to a noise to be applied at given application timing (Step 101). The voltage fluctuation level analysis unit 106 analyzes a voltage fluctuation when the noise is applied to a given location of the semiconductor integrated circuit, the noise being applied to the semiconductor integrated circuit at the given timing generated by the noise generation unit 104 (Step 103).

As thus described, the voltage fluctuation level analysis unit 106 accepts as inputs chip information from the chip information storage unit 10, package information from the package information storage unit 12 and noise information from the noise generation unit 104. The voltage fluctuation level analysis unit 106 then obtains voltage (VVDD and VGND) waveforms that appear at the VDD terminal and the GND terminal of each cell within the chip when noise is applied to a predetermined location of the package, such as the power-supply voltage unit (not shown in the drawings), and outputs to the timing verification unit 108 a normal voltage fluctuation at the time of the circuit operation and a voltage fluctuation obtained in view of the influence of noise from the outside. In addition, the voltage fluctuation is also referred to as a voltage drop or an Interconnection Resistance (IR)-drop.

Then, the timing verification unit 108 inputs the voltages output from the voltage fluctuation level analysis unit 106 into the VDD terminal and the GND terminal of each cell, and makes the delay analysis unit 102 analyze a delay in the path between each cell (Step S105), and verifies timing for operation of the semiconductor integrated circuit (Step S107).

As described above, according to the semiconductor integrated circuit design apparatus 100 of the exemplary embodiment of the invention, it is possible to analyze a delay in view of the influence of noise that is applied from the outside. The reason is as follows. Although the normal voltage fluctuation level in accordance with the operation of the chip is almost the same in each clock cycle, it is not known when power-supply noise is generated, the power-supply noise being applied from the outside of the chip. In the exemplary embodiment, noise is applied to the outside of the chip at arbitrary timing, thereby making it possible to determine whether the circuit can properly operate at any time when noise is applied from the outside of the chip.

Second Exemplary Embodiment

A semiconductor integrated circuit design apparatus 200 of the exemplary embodiment is different from the above exemplary embodiment in that a delay analysis is performed in view of voltage fluctuations in the case where a plurality of noises is applied to the semiconductor integrated circuit while varying intervals of application of the noise within the clock cycle.

Figure 4:
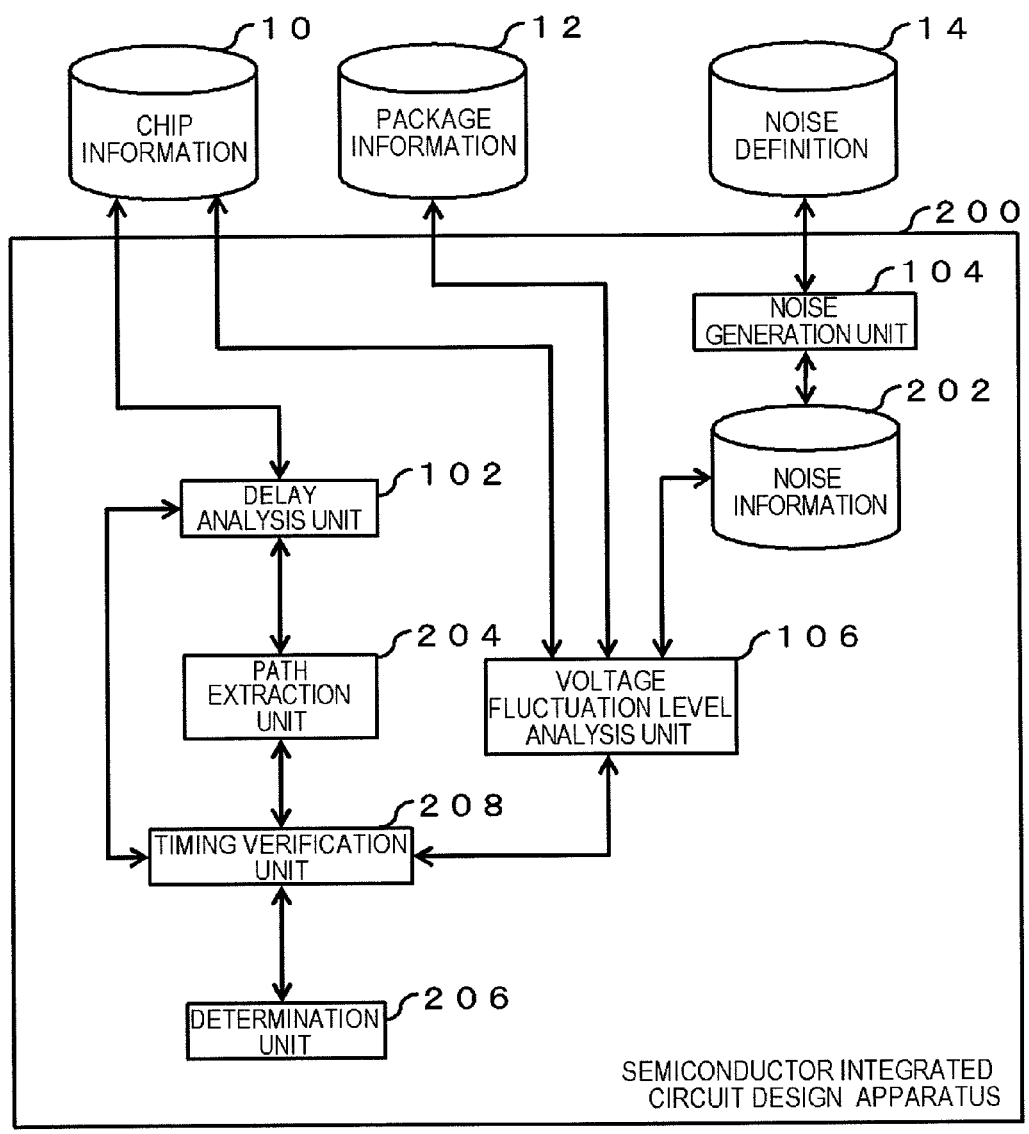
FIG. 4 is a functional block diagram showing a configuration of a semiconductor integrated circuit design apparatus according to an exemplary embodiment of the invention.

FIG. 4 is a functional block diagram showing a configuration of the semiconductor integrated circuit design apparatus 200 according to the exemplary embodiment. The semiconductor integrated circuit design apparatus 200 of the exemplary embodiment includes the delay analysis unit 102, the noise generation unit 104 and the voltage fluctuation level analysis unit 106, which are the same as those of the semiconductor integrated circuit design apparatus 100 of the above exemplary embodiment in FIG. 1, and further includes a noise information storage unit 202 (shown as "noise information" in the drawings), a path extraction unit 204, a determination unit 206 and a timing verification unit 208.

The noise information storage unit 202 stores the noise information generated by the noise generation unit 104. In this exemplary embodiment, the noise generation unit 104 generates noise information for simulation of a plurality of noises to be applied while varying intervals of the application of the noise within the clock cycle, and stores the generated information into the noise information storage unit 202. That is, the noise generation unit 104 can generate the noise information so that the noise information simulates noises that are irregularly applied from the outside of the semiconductor integrated circuit.

Figure 5:
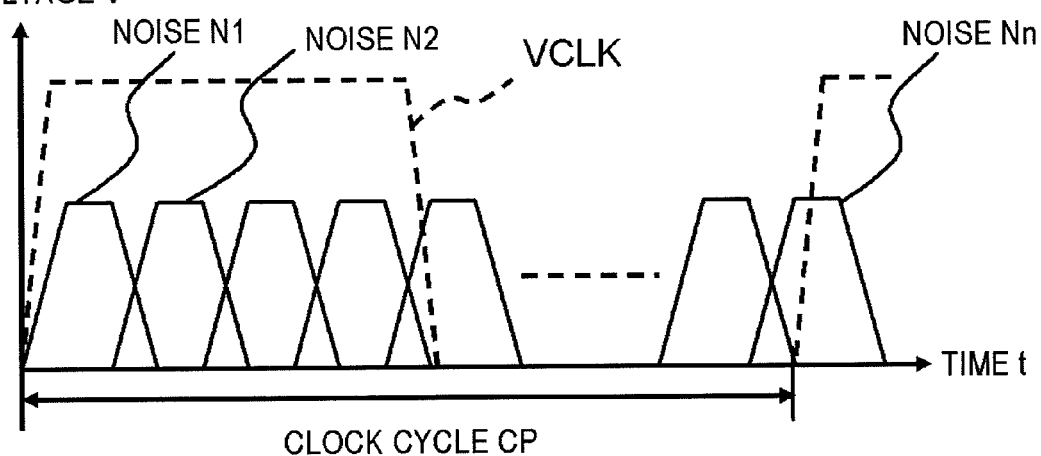
FIG. 5 is a diagram for explaining noise generated by a noise generation unit of the semiconductor integrated circuit design apparatus according to the exemplary embodiment of the invention.

The voltage fluctuation level analysis unit 106 sequentially reads out the noise information on the plurality of noises stored in the noise information storage unit 202, thereby to allow simulation of the noises which are applied while varying intervals of the noise within the clock cycle. Typically, as shown in FIG. 5, a clock cycle CP is divided into equal n-portions (n is a natural number), thereby allowing simulations of respective noises Nn to be repeatedly applied n-times while varying intervals respective corresponding to different application n-timings. That is, the voltage fluctuation level analysis unit 106 performs the analysis repeatedly n-times sequentially from a noise N1, a noise N2, ... to the noise Nn in FIG. 5. This enables consideration of the influence of the noises applied with different n-timings. The n-noises generated in this manner can simulate noises that are generated with timing irrespective of the fluctuation in clock voltage (VCLK) that fluctuates in line with the clock cycle CP.

It is to be noted that the noise definition storage unit 14 may store a variety of noise definitions. While the noise definition may be changed, the timing verification of the semiconductor integrated circuit may be then repeatedly executed. For example, the verification is first performed using a low voltage and noise having a waveform with a small wavelength, and the verification is then repeated on changed conditions such as gradually increased voltage or wavelength, so that maximal noise may also be obtained. Further, while the location for application of noise may be changed, the verification may be repeatedly performed.

From a result of the analysis performed by delay analysis unit 102, based on a predetermined extraction condition, the path extracting unit 204 extracts a path having the potential of not satisfying the design constraint condition due to the the influence of noise among respective paths between the cells inside the semiconductor integrated circuit. These extracted paths are output in the form applicable to the timing verification unit 208 as a circuit simulator. Namely, the outputs also include resistance of wiring, a parasitic capacitance and the like which were obtained by the delay analysis unit 102. Since the path extracting method and the like are not associated with the essence of the invention either, detailed descriptions thereof will not be repeated.

Figure 6:
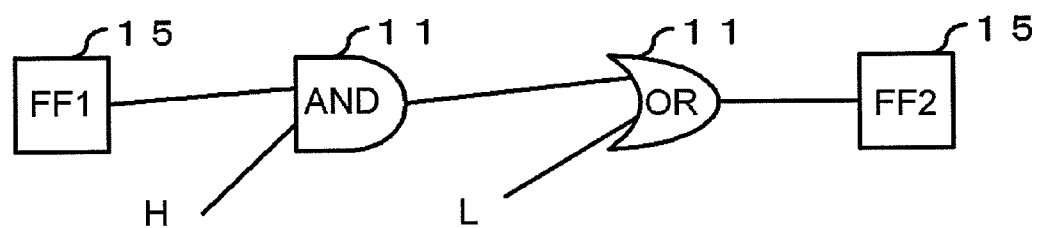
FIG. 6 is a diagram for explaining a path of a semiconductor integrated circuit on which a delay is analyzed in the semiconductor integrated circuit design apparatus according to the exemplary embodiment of the invention.

It is to be noted that in such a path as shown in FIG. 6, logic elements 11 (an AND cell and a OR cell are shown in FIG. 6) for performing an operation and control of the operation are arranged between two flip-flops 15 (FF1, FF2 in FIG. 6). In the semiconductor integrated circuit design apparatus 100 of the exemplary embodiment, as for the other input terminal of each logic element 11 on the path, a High signal is constantly input into the AND cell, and a Low signal is constantly input into the OR cell for the purpose of masking operational treatment of each logic element 11 in delay analysis processing, voltage fluctuation level analysis processing, timing verification processing, and the like.

The timing verification unit 208 makes the delay analysis unit 102 perform a delay analysis on respective paths extracted by the path extracting unit 204 based on voltage data in view of the influence of each noise output from the voltage fluctuation level analysis unit 106.

In the semiconductor integrated circuit design apparatus 200 of the exemplary embodiment, the timing verification unit 208 makes the delay analysis unit 102 analyze the delay while varying intervals of application timing of noise within the clock cycle CP, to repeatedly verify the timing on the semiconductor integrated circuit. That is, the noise generation unit 104 generates noise information on the n-noises N1 to Nn and stores the generated information into the noise information storage unit 202, and the voltage fluctuation level analysis unit 106 sequentially analyzes a voltage fluctuation level on each noise Ni (i is an integer from 1 to n) with reference to the noise information storage unit 202. The delay analysis unit 102 analyzes a delay based on the voltage fluctuation level analyzed in view of the influence of the noise Ni. In this manner, based on a result of the analysis in view of the effect of the noise Ni, the timing verification unit 208 repeatedly verifies the timing n-times with respect to each noise Ni.

Based on a result of the verification by the timing verification unit 208, the determination unit 206 determines whether or not the design constraint condition for the semiconductor integrated circuit is satisfied. The determination unit 206 summarizes a plurality of results of verification performed by the timing verification unit 208 while varying intervals of the application timing within the clock cycle CP, to check the result of the timing verification executed n-times on respective paths so as to determine whether the design constraint condition has been satisfied in all the times of verification, or the design constraint condition has not been satisfied even once.

The design constraint condition is a condition for the semiconductor integrated circuit to be operable in synchronization within the clock cycle. For example in the case of a clock frequency being 200 Hz, the clock cycle is 5 nsec, and the design constraint condition is thus set such that delay time of the path between the flip-flops 15 in FIG. 6 is equal to or shorter than 5 nsec.

The operation of the semiconductor integrated circuit design apparatus 200 of the exemplary embodiment as thus configured will be described hereinafter.

Figure 7:
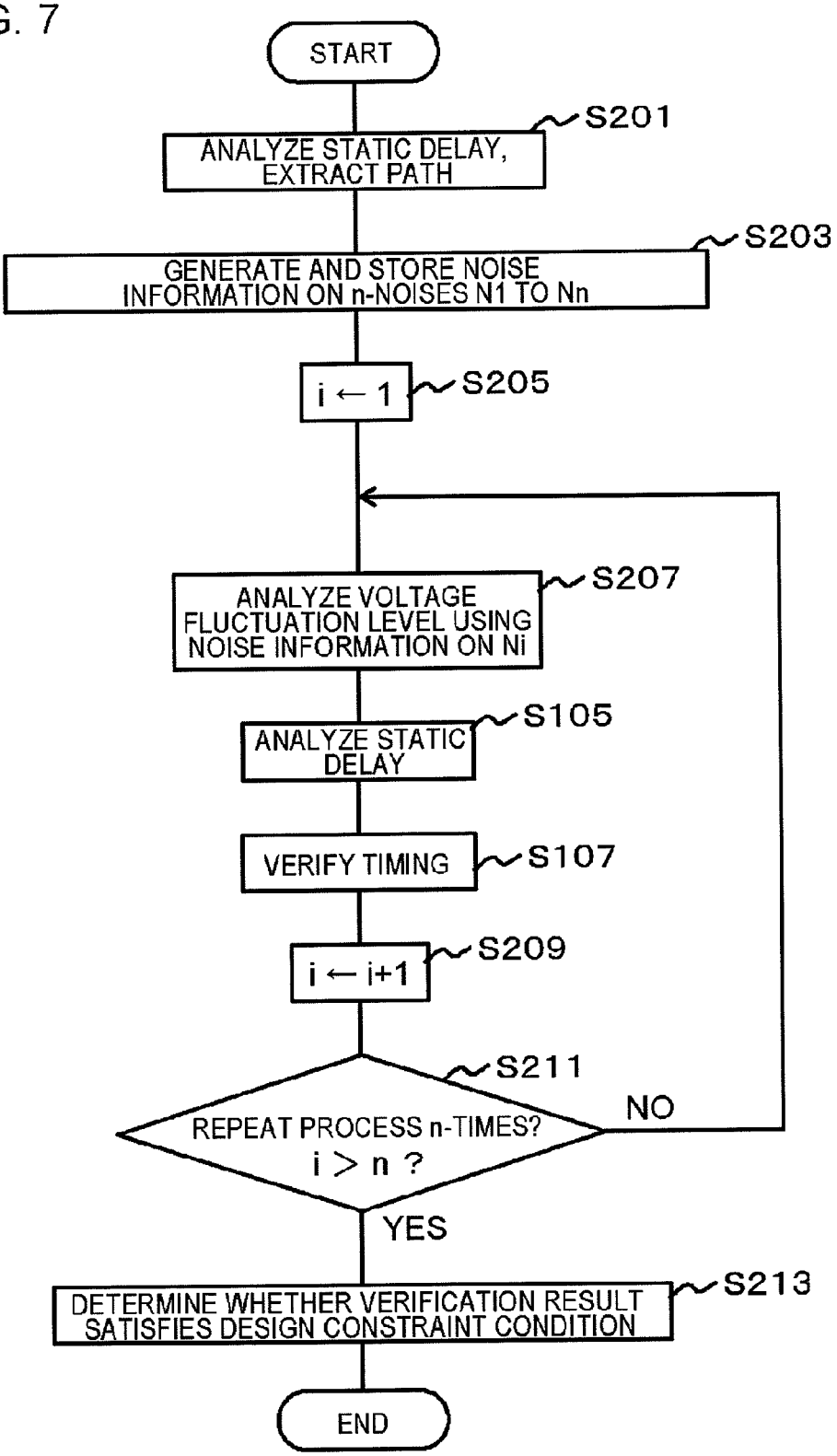
FIG. 7 is a flowchart showing an example of operations of the semiconductor integrated circuit design apparatus according to the exemplary embodiment of the invention.

FIG. 7 is a flowchart showing an example of the operations of the semiconductor integrated circuit design apparatus 200 according to the exemplary embodiment. The semiconductor integrated circuit design apparatus 200 of the exemplary embodiment has the same Steps S105 and S107 as those of the semiconductor integrated circuit design apparatus 100 of the above exemplary embodiment, and further includes Steps S201 to S213.

As shown in FIG. 7, in the exemplary embodiment, the path extracting unit 204 extracts a path having the potential of not satisfying the design constraint condition from a result of a delay analysis output from the delay analysis unit 102 (Step S201). Then, the noise generation unit 104 generates noise information on n-noises N1 to Nn, and stores the generated information into the noise information storage unit 202 (Step S203). Herein, 1 is set to a counter i (Step S205).

Then, the voltage fluctuation level analysis unit 106 performs a voltage fluctuation level analysis on each noise Ni with reference to the noise information storage unit 202 (Step S207). The timing verification unit 208 makes the delay analysis unit 102 perform a delay analysis based on a result of the voltage fluctuation level analysis in view of the influence of this noise Ni (Step S105), to perform timing verification based on a result of this analysis (Step S107). The counter i is then incremented (Step S209). In order to check that n-times of verification have been performed on the n-noises, it is determined whether or not i is larger than n (Step S211). The process is returned to Step S207 until i becomes larger than n, and the timing verification in view of the influence of each noise Ni is repeated n-times (NO in Step S211).

When n-times of timing verification are completed (YES in Step S211), the determination unit 206 summarizes a result of the verification on the n-noises, to determine whether or not the design constraint condition has been satisfied (Step S213). As a result of the verification on the n-noises, for example, when the design constraint condition has not been satisfied even once, it reveals that the influence of the noise may be exerted on the operation of the semiconductor integrated circuit. Based on these results, the semiconductor integrated circuit is subjected to cell rearrangement and rewiring, thereby to allow designing of a circuit satisfying the design constraint condition in view of of the influence of noise that is applied from the outside.

As described above, according to the semiconductor integrated circuit design apparatus 200 of the exemplary embodiment of the invention, it is possible to perform analysis and verification on the assumption of noise that is applied from the outside of the chip with a variety of timing, so as to determine whether the circuit can properly operate at any time of application of noise from the outside of the chip.

Third Exemplary Embodiment

A semiconductor integrated circuit design apparatus 300 of the exemplary embodiment is different from the above exemplary embodiments in that the number of noises used for the analysis is reduced. The semiconductor integrated circuit design apparatus 300 of the exemplary embodiment is further includes a control unit 302 which reduces repeat count of timing verification repeated by the timing verification unit 208 based on a result of the static delay analysis on respective paths of the semiconductor integrated circuit.

Figure 8:
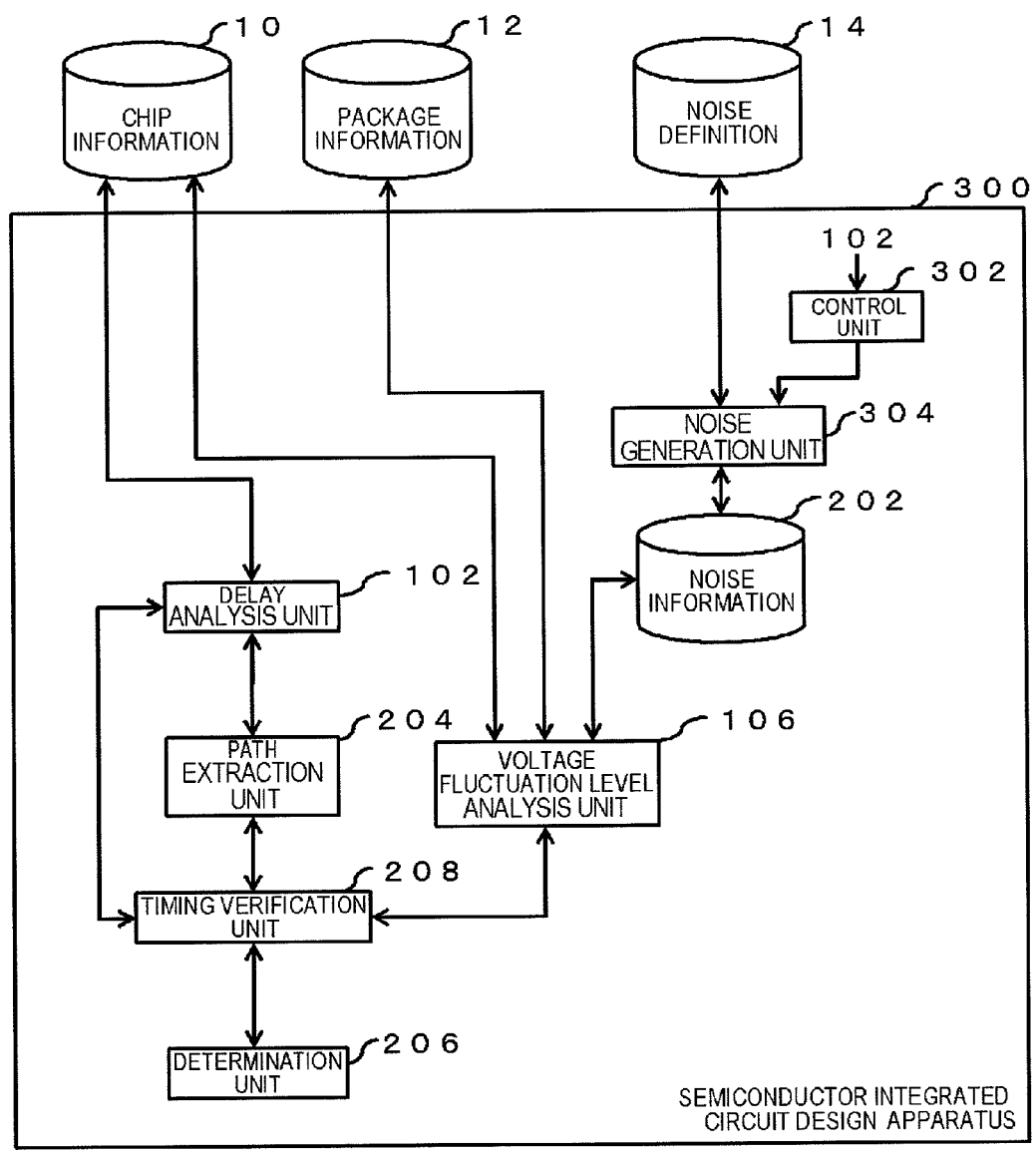
FIG. 8 is a functional block diagram showing a configuration of the semiconductor integrated circuit design apparatus according to the exemplary embodiment of the invention.

FIG. 8 is a functional block diagram showing a configuration of the semiconductor integrated circuit design apparatus 300 of the exemplary embodiment. The semiconductor integrated circuit design apparatus 300 of the exemplary embodiment includes the delay analysis unit 102, the voltage fluctuation level analysis unit 106, the noise information storage unit 202, the path extraction unit 204, the determination unit 206 and the timing verification unit 208, as those of the semiconductor integrated circuit design apparatus 100 or the semiconductor integrated circuit design apparatus 200 of the above exemplary embodiments, and further includes the control unit 302 and a noise generation unit 304.

Figure 9:
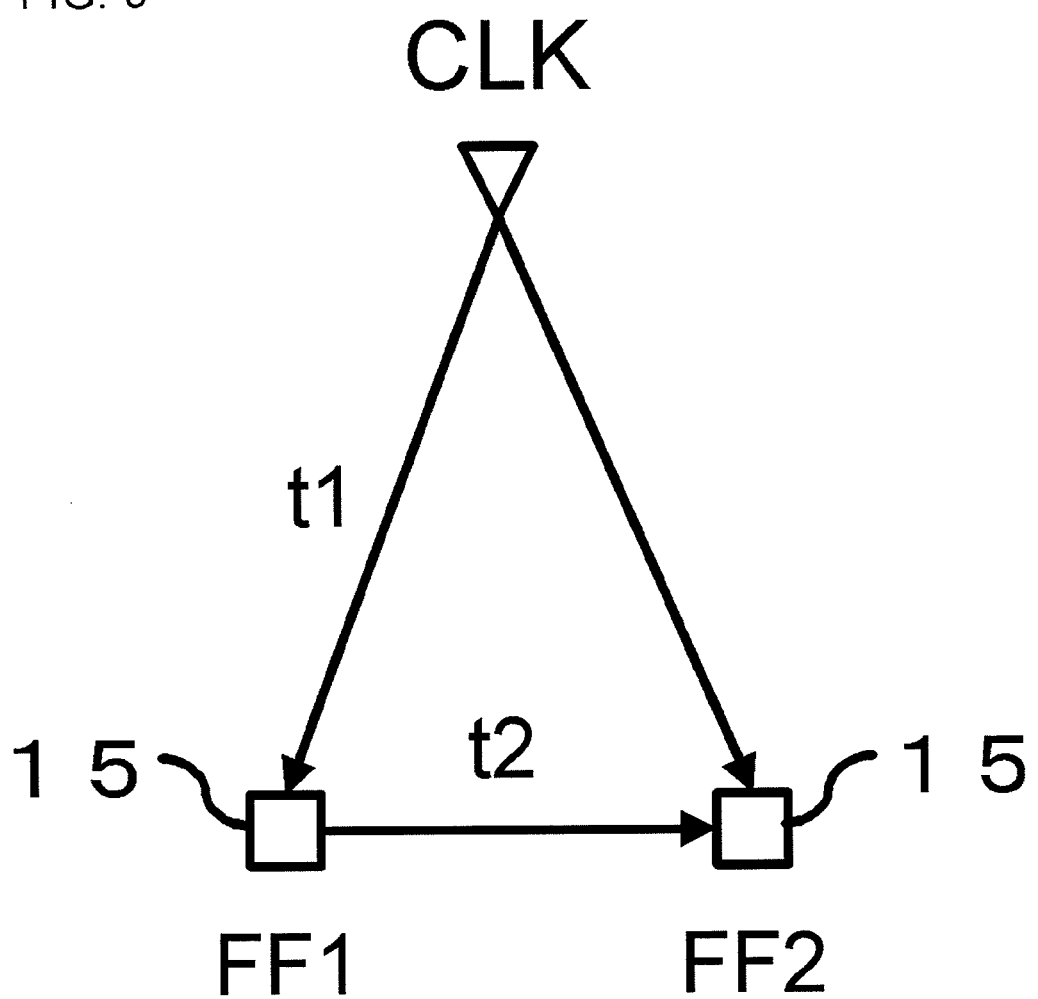
FIG. 9 is a diagram for explaining path delay time in the semiconductor integrated circuit design apparatus according to the exemplary embodiment of the invention.

As shown in FIG. 9, considering the case of analyzing a path starting from FF1 and arriving at FF2, time for transmission of a signal from a clock source CLK to FF1 is referred to as t1, and time for transmission of the signal from FF1 to FF2 is referred to as t2. When the signal is transmitted from the clock source CLK at a time t0, a time when the signal arrives at FF2 is "t1+t2", and only noise outside the chip which is applied during the time from the time t0 to the time t1+t2 has an influence on design constraint sufficiency of this path.

Based on results of the static delay analysis on respective paths which is input from the delay analysis unit 102, the control unit 302 calculates total time of first delay time t1 when the signal transmits from the clock source to the one flip-flop FF1 of respective paths and second delay time t2 when the signal transmits to the other flip-flop FF2 of the same, to reduce the repeat count so as to make the timing verifying unit repeat the timing verification within the total time t1+t2 from the start of the clock cycle CP.

Figure 10:
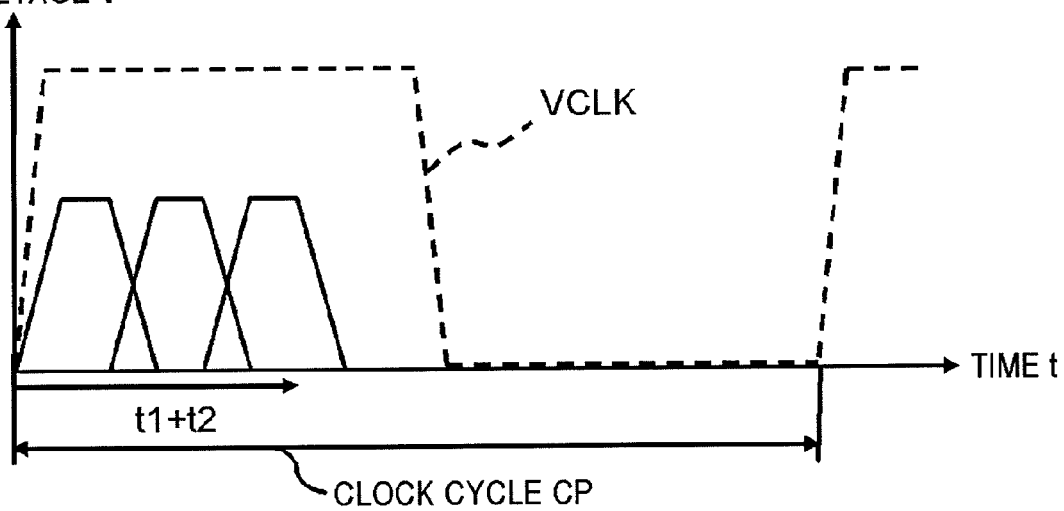
FIG. 10 is a diagram for explaining an example of cases of reduction in number of noises generated by the noise generation unit of the semiconductor integrated circuit design apparatus according to the exemplary embodiment of the invention.
Figure 11:
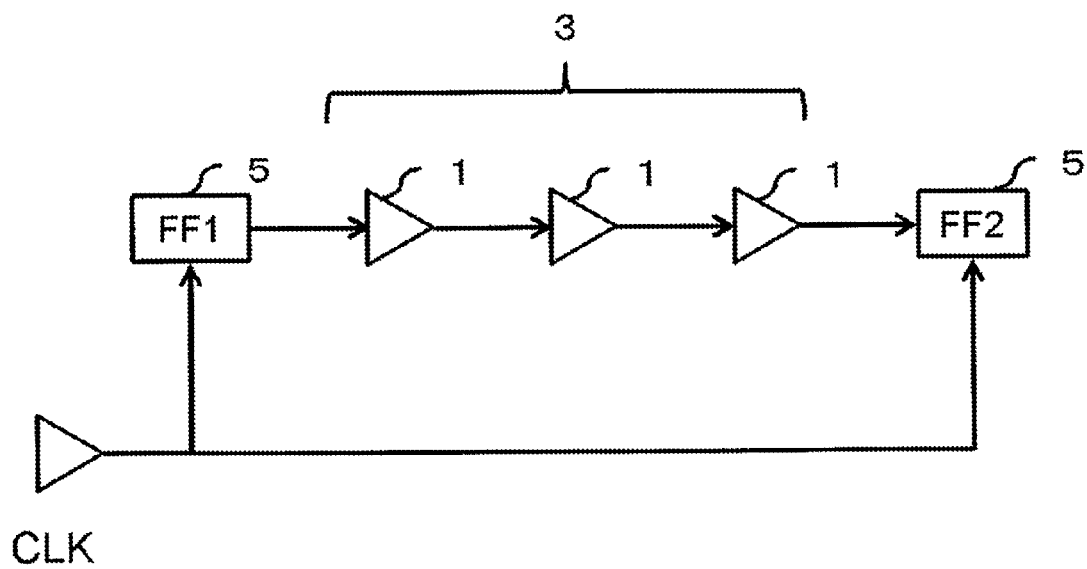
FIG. 11 is a circuit diagram showing a configuration of a basic semiconductor integrated circuit.

Hence in the exemplary embodiment, in accordance with a direction from the control unit 302, the noise generation unit 304 can only generate noise to be applied until the time t1+t2 within the clock cycle CP as shown in FIG. 10 based on a result of the analysis of the delay analysis unit 102. It is thereby possible to narrow down the noise to be generated, to improve analysis execution speed. Further, also herein, the generated noise may simulate noise that is generated with timing irrespective of the fluctuation in clock voltage VCLK that fluctuates in line with the clock cycle CP.

Although the exemplary embodiments of the invention have been described above with reference to the drawings, these are exemplification of the invention, and a variety of configurations other than the above can be adopted.

EXAMPLE

Hereinafter, a configuration and an operation of the best mode for carrying out the invention will be described using a specific example.

One chip was subjected to a delay analysis in view of the influence of noise. Encounter (registered trademark) manufactured by Cadence Design Systems, Inc. was used as the delay analysis unit to analyze a static delay, RedHawk (registered trademark) manufactured by Apache Design Solutions, Inc. was used as the voltage fluctuation level analysis unit to analyze a voltage fluctuation level, and SPICE (registered trademark) was used as the timing verification unit to verify timing.

The delay analysis was performed several times while the noise definition was changed. As a result, maximal noise was determined, with which the chip normally operates, namely the design constraint condition is satisfied.

The design constraint condition of the semiconductor integrated circuit is, for example, that a delay in a clock signal does not exceed the clock cycle. For example, when the clock cycle is 1/200 msec (5 nsec), a delay condition is equal to or shorter than 5 nsec.

While the invention has been particularly shown and described with reference to exemplary embodiments and examples thereof, the invention is not limited to these embodiments and examples. It will be understood by those of ordinary skill in the art that various changes in form and details may be made therein without departing from the spirit and scope of the present invention as defined by the claims.

This application is based upon and claims the benefit of priority from Japanese Patent Application No. 2009-121783 filed on May 20, 2009, the disclosure of which is incorporated herein in its entirety by reference.

The invention claimed is:

1. A semiconductor integrated circuit design apparatus, comprising:
    a delay analysis unit which analyzes a static delay based on chip information on a semiconductor integrated circuit, said semiconductor integrated circuit including flip-flops, said static delay being analyzed on respective paths between said flip-flops;
    a noise generation unit which generates, based on a predetermined noise definition, noise information on a noise to be applied to said semiconductor integrated circuit;
    a voltage fluctuation level analysis unit which analyzes, based on said chip information on said semiconductor integrated circuit, a voltage fluctuation level of said semiconductor integrated circuit, said voltage fluctuation level being analyzed when said noise is applied to a predetermined location of said semiconductor integrated circuit based on said noise information;
    a timing verification unit which makes said delay analysis unit analyze said static delay based on said voltage fluctuation level analyzed by said voltage fluctuation level analysis unit, said timing verification unit verifying timing for operation of said semiconductor integrated circuit based on a result of analysis on said static delay in respective paths of said semiconductor integrated circuit, said timing verification unit repeatedly verifying said timing on said semiconductor integrated circuit while varying intervals of a predetermined application timing of the noise within a clock cycle; and
    a control unit which reduces a number of times the timing verification is repeated by said timing verification unit, said number of times being reduced based on the result of analysis on said static delay in said respective paths of said semiconductor integrated circuit,
    wherein said noise generation unit generates noise information on said noise to be applied at said predetermined application timing, and said timing verification unit verifies said timing with respect to each noise that is applied at said predetermined application timing,
    wherein said control unit calculates a total time of a first delay time and a second delay time based on the result of said analysis on said static delay in said respective paths, said first delay time being time taken to transmit a signal from a clock source to one flip-flop of said respective paths, said second delay time being time taken to transmit a signal to the other flip-flop from said one flip-flop, and said control unit reduces said number of times the timing verification is repeated so as to make said timing verification unit repeatedly verify said timing within said total time from the start of said clock cycle, and
    wherein the predetermined application timing is independent of a clock cycle.

2. The semiconductor integrated circuit design apparatus according to claim 1, further comprising a determination unit which determines, based on a result of the verification by the timing verification unit, whether or not a design constraint condition for the semiconductor integrated circuit is satisfied.

3. The semiconductor integrated circuit design apparatus according to claim 1, wherein said semiconductor integrated circuit design apparatus changes said noise definition and repeatedly verifies the timing on said semiconductor integrated circuit.

4. The semiconductor integrated circuit design apparatus according to claim 1, comprising a noise information storage unit which stores said noise information generated by said noise generation unit.

5. The semiconductor integrated circuit design apparatus according to claim 1, wherein said noise generation unit generates noise information so that said noise information simulates noise that is irregularly applied from the outside of said semiconductor integrated circuit.

6. A data processing method of a semiconductor integrated circuit design apparatus,
wherein said semiconductor integrated circuit design apparatus performs:
analyzing a static delay based on chip information on a semiconductor integrated circuit, said semiconductor integrated circuit including flip-flops, said static delay being analyzed on respective paths between said flip-flops;
generating, based on a predetermined noise definition, noise information on a noise to be applied to said semiconductor integrated circuit;
analyzing, based on said chip information on said semiconductor integrated circuit, a voltage fluctuation level of said semiconductor integrated circuit, said voltage fluctuation level being analyzed when said noise is applied to a predetermined location of said semiconductor integrated circuit based on said noise information;
analyzing said static delay in said respective paths between said flip-flops in said semiconductor integrated circuit based on said chip information on said semiconductor integrated circuit in accordance with the analyzed voltage fluctuation level; and
verifying timing for operation of said semiconductor integrated circuit based on a result of analysis on said static delay in respective paths of said semiconductor integrated circuit, said timing being verified with respect to each noise that is applied at a predetermined application timing,
wherein said semiconductor integrated circuit design apparatus performs an operation of repeatedly verifying said timing on said semiconductor integrated circuit while varying intervals of said predetermined application timing of said noise within a clock cycle,
wherein said semiconductor integrated circuit design apparatus performs reducing a number of times the timing verification is repeated, based on the result of analysis on said static delay in respective paths of said semiconductor integrated circuit,
wherein said semiconductor integrated circuit design apparatus performs calculates a total time of a first delay time and a second delay time based on the result of said analysis on said static delay in said respective paths, said first delay time being time taken to transmit a signal from a clock source to one flip-flop of said respective paths, said second delay time being time taken to transmit a signal to the other flip-flop from said one flip-flop, and said control unit reduces said number of times the timing verification is repeated so as to make said timing verification unit repeatedly verify said timing within said total time from the start of said clock cycle, and
wherein the predetermined application timing is independent of a clock cycle.

7. The data processing method of a semiconductor integrated circuit design apparatus according to claim 6, wherein said semiconductor integrated circuit design apparatus performs generating said noise information so that said noise information simulates noise that is irregularly applied from the outside of said semiconductor integrated circuit.

8. A non-transitory computer-readable medium containing control program instructions in a semiconductor integrated circuit design apparatus, which make a computer execute:

a procedure for analyzing a static delay based on chip information on a semiconductor integrated circuit, said semiconductor integrated circuit including flip-flops, said static delay being analyzed on respective paths between flip-flops;
a procedure for generating, based on a predetermined noise definition, noise information on a predetermined noise to be applied to said semiconductor integrated circuit;
a procedure for analyzing, based on said chip information on said semiconductor integrated circuit, a voltage fluctuation level of said semiconductor integrated circuit, said voltage fluctuation level being analyzed when said noise is applied to a predetermined location of said semiconductor integrated circuit based on said noise information;
a procedure for making the procedure for analyzing the static delay analyze the static delay based on said voltage fluctuation level, said voltage fluctuation level being analyzed by the procedure for analyzing the voltage fluctuation level;
a procedure for verifying timing for operation of said semiconductor integrated circuit based on a result of analysis on said static delay in respective paths of said semiconductor integrated circuit;
a procedure for generating noise information on noise to be applied at a predetermined application timing; and
a procedure for verifying the timing with respect to each noise that is applied at said predetermined application timing,
wherein the control program of a semiconductor integrated circuit design apparatus makes the computer further execute a procedure for repeatedly verifying said timing on said semiconductor integrated circuit while varying intervals of said predetermined application timing of said noise within a clock cycle, and
execute a procedure for reducing a number of times the timing verification is repeated, based on the result of analysis on the static delay in respective paths of said semiconductor integrated circuit,
wherein the control program of a semiconductor integrated circuit design apparatus makes the computer further execute a procedure for calculating a total time of a first delay time and a second delay time based on the result of said analysis on said static delay in said respective paths, said first delay time being time taken to transmit a signal from a clock source to one flip-flop of said respective paths, said second delay time being time taken to transmit a signal to the other flip-flop from said one flip-flop, and said control unit reduces said number of times the timing verification is repeated so as to make said timing verification unit repeatedly verify said timing within said total time from the start of said clock cycle, and
wherein the predetermined application timing is independent of a clock cycle.

9. The non-transitory computer-readable medium containing control program instructions of a semiconductor integrated circuit design apparatus according to claim 8, which makes a computer execute a procedure for generating said noise information so that said noise information simulates noise that is irregularly applied from the outside of said semiconductor integrated circuit.

10. semiconductor integrated circuit design apparatus, comprising:
a delay analysis means for analyzing a static delay based on chip information on a semiconductor integrated circuit, said semiconductor integrated circuit including flip-flops, said static delay being analyzed on respective paths between said flip-flops;

a noise generation means for generating, based on a predetermined noise definition, noise information on a noise to be applied to said semiconductor integrated circuit, said noise generation means generates the noise information on said noise to be applied at a predetermined application timing;

a voltage fluctuation level analysis means for analyzing, based on said chip information on said semiconductor integrated circuit, a voltage fluctuation level of said semiconductor integrated circuit, said voltage fluctuation level being analyzed when said noise is applied to a predetermined location of said semiconductor integrated circuit based on said noise information;

a timing verification means for making said delay analysis means analyze said static delay based on said voltage fluctuation level analyzed by said voltage fluctuation level analysis means, said timing verification means verifying timing for operation of said semiconductor integrated circuit based on a result of analysis on said static delay in respective paths of said semiconductor integrated circuit, said timing verification means verifies said timing with respect to each noise that is applied at said predetermined application timing and repeatedly verifies said timing on said semiconductor integrated circuit while varying intervals of the predetermined application timing of the noise within a clock cycle; and a control means for reducing a number of times the timing verification is repeated by said timing verification means, said number of times being reduced based on the result of analysis on said static delay in said respective paths of said semiconductor integrated circuit, wherein said noise generation means generates noise information on said noise to be applied at predetermined application timing, and said timing verification means verifies said timing with respect to each noise that is applied at said predetermined application timing, wherein said control means calculates a total time of a first delay time and a second delay time based on the result of said analysis on said static delay in said respective paths, said first delay time being time taken to transmit a signal from a clock source to one flip-flop of said respective paths, said second delay time being time taken to transmit a signal to the other flip-flop from said one flip-flop, and said control means reduces said number of timed the timing verification is repeated so as to make said timing verification means repeatedly verify said timing within said total time from the start of said clock cycle, and wherein the predetermined application timing is independent of a clock cycle.

* * * * *

UNITED STATES PATENT AND TRADEMARK OFFICE
CERTIFICATE OF CORRECTION

PATENT NO.         : 8,458,633 B2                                    Page 1 of 1
APPLICATION NO.    : 13/262759
DATED              : June 4, 2013
INVENTOR(S)        : Yoshihiro Ono et al.

It is certified that error appears in the above-identified patent and that said Letters Patent is hereby corrected as shown below:

In the Specification

Column 1, Line 12: Delete "2003," and insert -- 2009, --

In the Claims

Column 18, Line 20: In Claim 10, delete "timed" and insert -- times --

Signed and Sealed this
Twenty-first Day of October, 2014

Michelle K. Lee
*Deputy Director of the United States Patent and Trademark Office*